United States Patent
MacNeil

(10) Patent No.: US 6,640,840 B1
(45) Date of Patent: Nov. 4, 2003

(54) DELIVERY OF LIQUID PRECURSORS TO SEMICONDUCTOR PROCESSING REACTORS

(75) Inventor: John MacNeil, Cardiff (GB)

(73) Assignee: Trikon Holdings Limited, Gwent (GB)

( * ) Notice: Subject to any disclaimer, the term of this patent is extended or adjusted under 35 U.S.C. 154(b) by 0 days.

(21) Appl. No.: 09/667,329

(22) Filed: Sep. 21, 2000

(30) Foreign Application Priority Data

Sep. 25, 1999 (GB) .............................................. 9922691

(51) Int. Cl.⁷ ................................................. B65B 3/04
(52) U.S. Cl. ........................... 141/1; 141/102; 141/104; 141/105; 141/126; 141/127; 141/198; 118/715; 118/726
(58) Field of Search ................................. 141/1, 63, 64, 141/67, 69, 82, 94, 100, 102, 104, 105, 126, 127, 192, 198, 285; 118/715, 726; 427/248.1

(56) References Cited

U.S. PATENT DOCUMENTS

| | | |
|---|---|---|
| 3,223,040 A | 12/1965 | Dinkelkamp |
| 4,793,524 A | 12/1988 | Starr |
| 5,095,938 A | 3/1992 | Garrison |
| 5,098,741 A | 3/1992 | Nolet et al. |
| 5,195,655 A | 3/1993 | Bukhman |
| 5,356,034 A | 10/1994 | Schlumberger |
| 5,534,069 A | 7/1996 | Kuwabara et al. |
| 5,566,865 A * | 10/1996 | Jouillat et al. .............. 222/287 |
| 5,567,122 A * | 10/1996 | Schulte ........................ 417/214 |
| 5,620,524 A | 4/1997 | Fan et al. |
| 5,730,804 A | 3/1998 | Gomi et al. |
| 5,874,131 A * | 2/1999 | Vaartstra et al. ............ 427/124 |
| 5,876,503 A | 3/1999 | Roeder et al. |
| 5,906,682 A * | 5/1999 | Bouras et al. .............. 118/323 |
| 5,916,524 A * | 6/1999 | Tisone ........................ 118/305 |
| 6,116,184 A * | 9/2000 | Solayappan et al. ....... 118/50.1 |
| 6,402,126 B2 * | 6/2002 | Vaartstra et al. ............ 118/708 |

FOREIGN PATENT DOCUMENTS

| | | |
|---|---|---|
| EP | 0 529 334 | 3/1993 |
| GB | 2 220 869 | 1/1990 |
| GB | 2 280 169 | 1/1995 |
| WO | WO 96/29576 | 6/1996 |
| WO | WO 98/23787 | 6/1998 |

\* cited by examiner

*Primary Examiner*—Timothy L. Maust
(74) *Attorney, Agent, or Firm*—Volentine Francos, PLLC

(57) ABSTRACT

This invention relates to methods and apparatus for delivering liquid precursors to semi-conductor processing apparatus. The liquid precursor delivery system is generally indicated at (10) and includes a source (11), an inlet tube (12), a two-way valve (13), a pump assembly (14), an outlet tube (15), a shut-off valve (16) and a flash evaporator (17). The pump assembly (14) is in the form of a syringe or variable volume pump and is controlled by a combination of a step motor (27) and a linear encoder (30). The arrangement is such that unused liquid precursor can be returned to the source.

4 Claims, 3 Drawing Sheets

DELIVERY OF LIQUID PRECURSORS TO SEMICONDUCTOR PROCESSING REACTORS

This invention relates to methods and apparatus for delivering liquid precursors to semiconductor processing reactors.

There is a good discussion of various prior art proposals for delivering such precursors in the preamble of U.S. Pat. No. 5,620,524 and the reader is referred to this. In general a liquid precursor will be a gas at the low pressures, which typically exist in the reactor (e.g. 1 torr), but at atmospheric pressure (15 torr) they will be in their liquid state. This gives rise to practical delivery and measurement problems, which are exacerbated by the highly reactive nature of many of these precursors, which limit the choice of engineering materials that may be used. Most liquid precursor delivery systems, which are used in wafer processing, are of one of the following three types:

1. There is vaporisation of the liquid and the use of a gas mass flow controller.
2. Use of a liquid mass flow controller.
3. A carrier gas is passed through a liquid in a "bubbler" to vaporise some of the liquid in the carrier gas bubbles.

Whilst gas mass flow measuring instruments are widely used, they present problems when the liquid has to be vaporised for mass flow measurement. A large reservoir of vaporised liquid is required, which increases the residence time of the vaporised liquid at a raised temperature. For peroxide, which is a useful precursor, decomposition may commence before it reaches the process chamber. Liquid mass flow controllers are capable of giving good flow control but are liable to instabilities, believed to be caused by bubbles forming in the mass flow controller whilst in its idle state and the cold liquid cooling the controller can cause calibration drift. Bubblers require a carrier gas and the lower the vapour pressure, the less liquid that is taken up as vapour by the bubbles. Therefore, for low vapour pressure liquids, a high flow of carrier gas is required and that may be incompatible with the process.

As alternatives to these approaches, an arrangement similar to that shown in U.S. Pat. No. 5,620,524 has been tried comprising a positive displacement pump in combination with a narrow bore outlet pipe, but as well as difficulties in selecting appropriate materials for such pumps and other parts, flow variations are experienced due to variations in bore of the narrow bore pipe, necessary to buffer the low pressure chamber from the pump. Such arrangements are susceptible to variations because the flow restriction of the narrow bore pipe dominates as the pump is essentially only a pressurisation device. The results of this method are referred to as "standard" in FIG. 3 below.

A simpler version of this system can be used if a pre-set or fixed flow is acceptable. The system then entirely depends on the action of ambient pressure upon the liquid to replace the use of the pump and the flow restricting tubing to control flow. This system makes use of the fact that clean rooms are pressure controlled environments at slightly above atmospheric pressure. The system is still however dependent on the internal bore diameter of the pipe being accurate and in suitably compatible materials this is not often the case. Specific system calibration can therefore become necessary and different pipe lengths may need to be used depending on the actual bore diameter. The results of this method are referred to as "fixed flow" in FIG. 3 below.

U.S. Pat. No. 5,620,524 describes an alternative using out-of-phase piston pumps, but it relies on the system knowing various characteristics of the precursor and monitoring the temperature and pressure of the precursor in order to deliver a desired mass of precursor.

U.S. Pat. No. 5,098,741 describes the use of a positive displacement pump to feed a liquid precursor to a CVD chamber, but the system requires the use of a pressure metre controlling a variable orifice valve to overcome the problem of dissolved gases.

From one aspect the invention consists in apparatus for delivering a liquid precursor to a semiconductor processing reactor comprising a source of a liquid precursor, a volume calibrated positive displacement pump drawing liquid precursor from the source via an input path and for delivering, along an output path, (preferably without any pressure control and/or pulsing) a known volume of liquid precursor to the reactor. Either just prior to the reactor or within the reactor the liquid precursor may be evaporated, for example by a flash evaporator.

The apparatus may further include a valve for connecting the pump to the input path or the output path. The apparatus may further comprise control means for controlling the pump and the valve whereby the pump draws liquid in, whilst the reactor is not processing with this precursor. Additionally or alternatively the apparatus may further include control means for controlling the pump and the valve whereby the pump returns any undelivered precursor to the source. This recucling, particularly when combined with the pump only being charged when needed, significantly reduces the presence of dissolved gases.

The pump may be in the form of a syringe pump.

The source may include another reservoir of liquid precursor and preferably the source may include at least two bottles or reservoirs and means for automatically connecting one bottle or reservoir to the inlet path as the other becomes empty.

The apparatus preferably includes a linear encoder controlled stepper motor for driving the pump to deliver the known volume.

From another aspect the invention consists in a method of delivering a liquid precursor to a semiconductor processing reactor including:

1. Delivering a liquid precursor, along an input path, into a volume calibrated positive displacement pump from a source of liquid precursor;
2. Delivering, along an output path, preferably without pressure control and/or pulsing a known volume of liquid precursor to the reactor.

The liquid precursor may be evaporated either just before it reaches the reactor or within the reactor.

This may further include permanently connecting the pump to the input path and the output path. Additionally or alternatively, after each volume delivery, the pump may return any remaining liquid to the source, before drawing a fresh charge.

Although the invention has been defined above it is to be understood it includes any inventive combination of the features set out above or in the following description.

The invention may be performed in various ways and specific embodiments will now be described, by way of example, with reference to the accompanying drawing in which.

Figure 1:
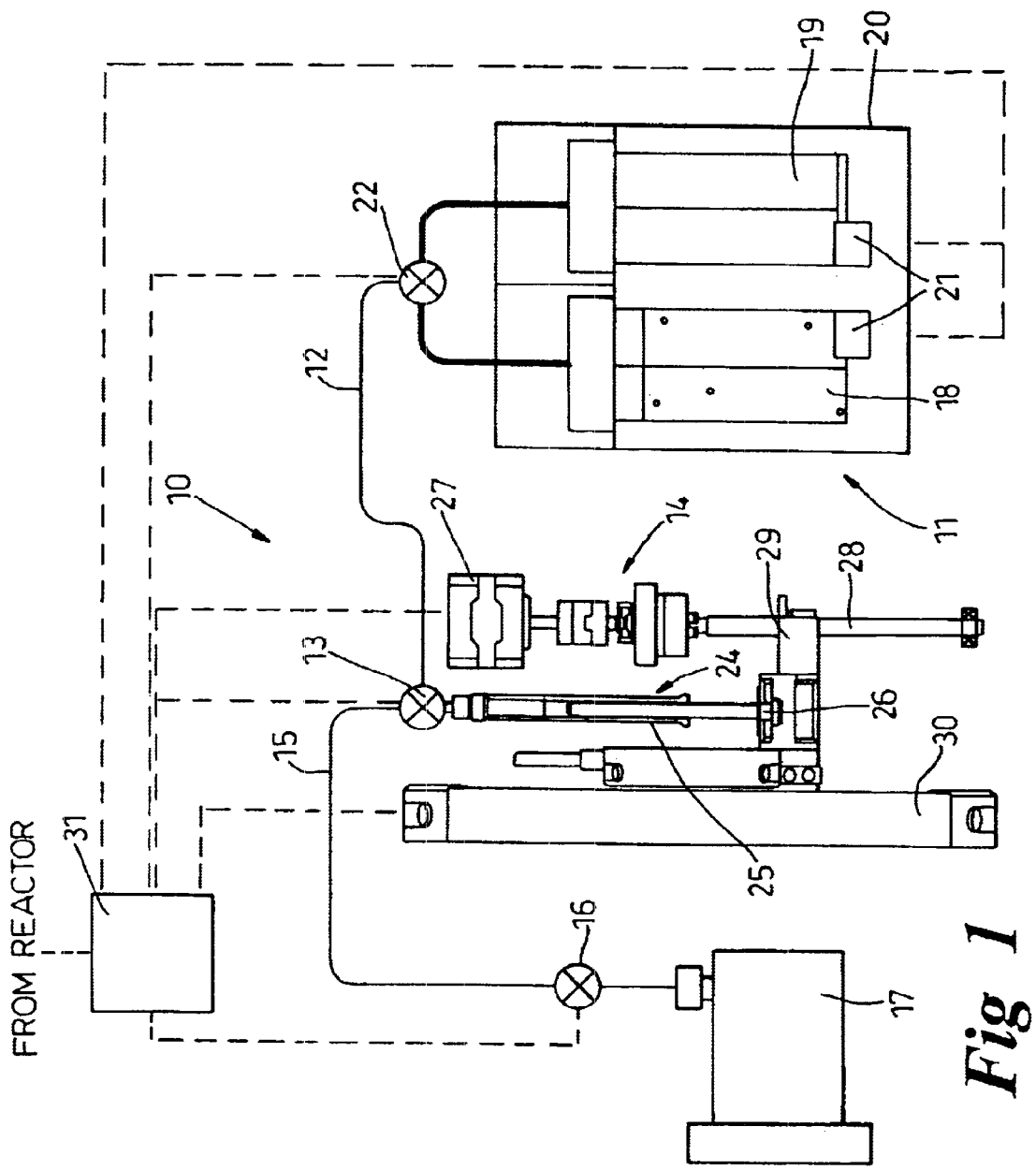
FIG. 1 is a schematic view of a liquid precursor delivery system.

A liquid precursor delivery system is generally indicated at 10 in FIG. 1. The system 10 includes a carriage 29 is revealed very precisely by the linear encoder 30, the position of the piston 26, and hence the volume of liquid displaced, can be very tightly controlled and without relying on the pump being operated over a precisely set time period. Further the whole arrangement enables liquid to be expelled at high pressure.

The pump assembly 14 and valves 13, 16 and 22 are all under the control of a control circuit 31, which is in turn responsive to the linear encoder 30 and the level sensors 21, as well as other processing information from the associated reactor.

In use the stepper motor 27 initially draws the carriage 29 in a downward direction, which moves the piston in a withdrawing sense within the tube 25. With the valve 13 set to connect the pump 24 to the liquid source 11, the liquid precursor can be drawn from one or other of the bottles 18, 19 depending on the position of the valve 22. Once the pump 24 is charged, the stepper motor 27 stops. The valve 13 is then switched to connect the syringe pump 24 to the outlet tube 15 and at the right moment, in processing, the shut off valve 16 is opened and the stepper motor reverses the motion to drive the piston 26 back within the tube 25 causing liquid precursor to be delivered into the flash evaporator 17. The volume of precursor source generally indicated at 11, an inlet tube 12, a two-way valve 13, a pump assembly, generally indicated at 14, an outlet tube 15, a shut off valve 16, and a flash evaporator 17.

The liquid precursor source 11 comprises a pair of bottles 18, 19 contained within a temperature controlled chamber 20, level sensors, schematically indicated at 21 detect the level of liquid in the respective bottles 18, 19. The bottles 18, 19 are connected to a valve 22 and thence to the inlet tube 12. The valve 22 is arranged to connect one or other of the bottles 18, 19 to the tube 12.

The pump assembly 14 is of the type generally known as a syringe or variable volume pump, such as, for example, made by Lee Products in their LPV series. Such pumps have a syringe 24 comprising a tube 25 and a piston 26. The piston is linked to a stepper motor 27 and in general means are provided for detecting the linear movement of the piston to determine the volume of liquid expelled from the syringe.

In the illustrated arrangement the stepper motor 27 drives a lead screw 28 which in turn linearly moves a carriage 29 that is connected to the free end of the piston 26. The linear position of the carriage 29 is detected by a linear encoder 30. As the position of the liquid expelled is directly related to the travel of the piston 26 and hence of the carriage 29. This can be monitored by the control circuit 31 via the linear encoder 30 and as soon as the desired volume is achieved, the stepper motor 27 is turned off. Thus it will be seen that very precise volumes of liquid precursor can be delivered at high pressure into the evaporator without the problems which arise with other systems.

It is preferred that the syringe is filled with more than the required volume to prevent any shortage in delivery. Conveniently, then the unexpelled liquid can be returned to the bottles 18, 19 via a valve 13, tube 12 and valve 23 so that the liquid precursor can be kept in the best conditions possible.

The provision of two bottles enables one bottle to be switched over when it becomes empty, without any interruption in processing being necessary.

It is thus anticipated that wafers or batches of wafers can be introduced into the reactor chamber, a precise volume of liquid precursor delivered into the chamber via the flash evaporator 17 and thereafter the pump can be emptied and recharged ready for the next wafer or batch.

Figure 2:
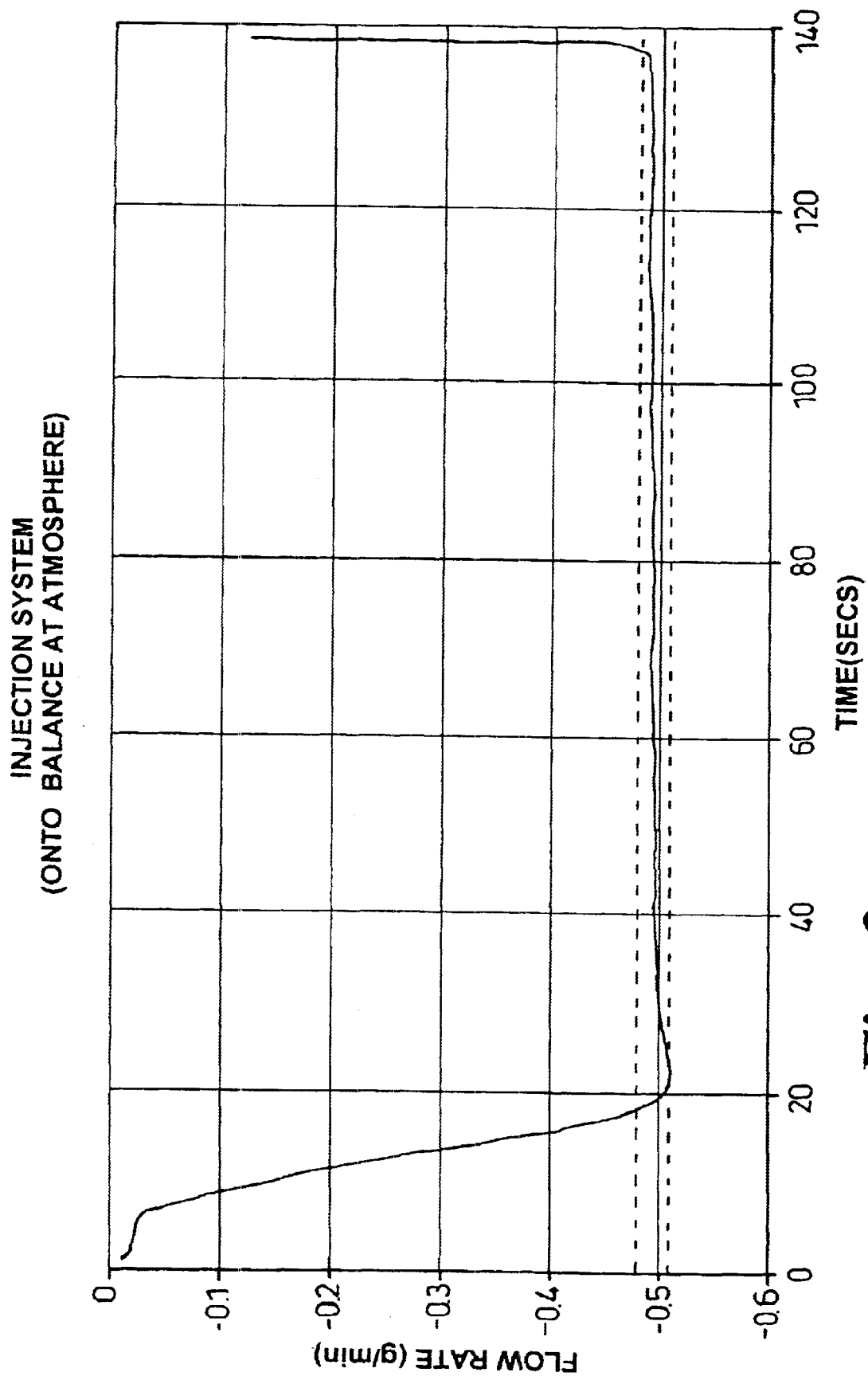
FIG. 2 is a graph indicating flow rate from the system.

FIG. 2 illustrates the linearity in flow rate that can be achieved with the system of the invention and hence the accuracy of volume delivery.

Figure 3:
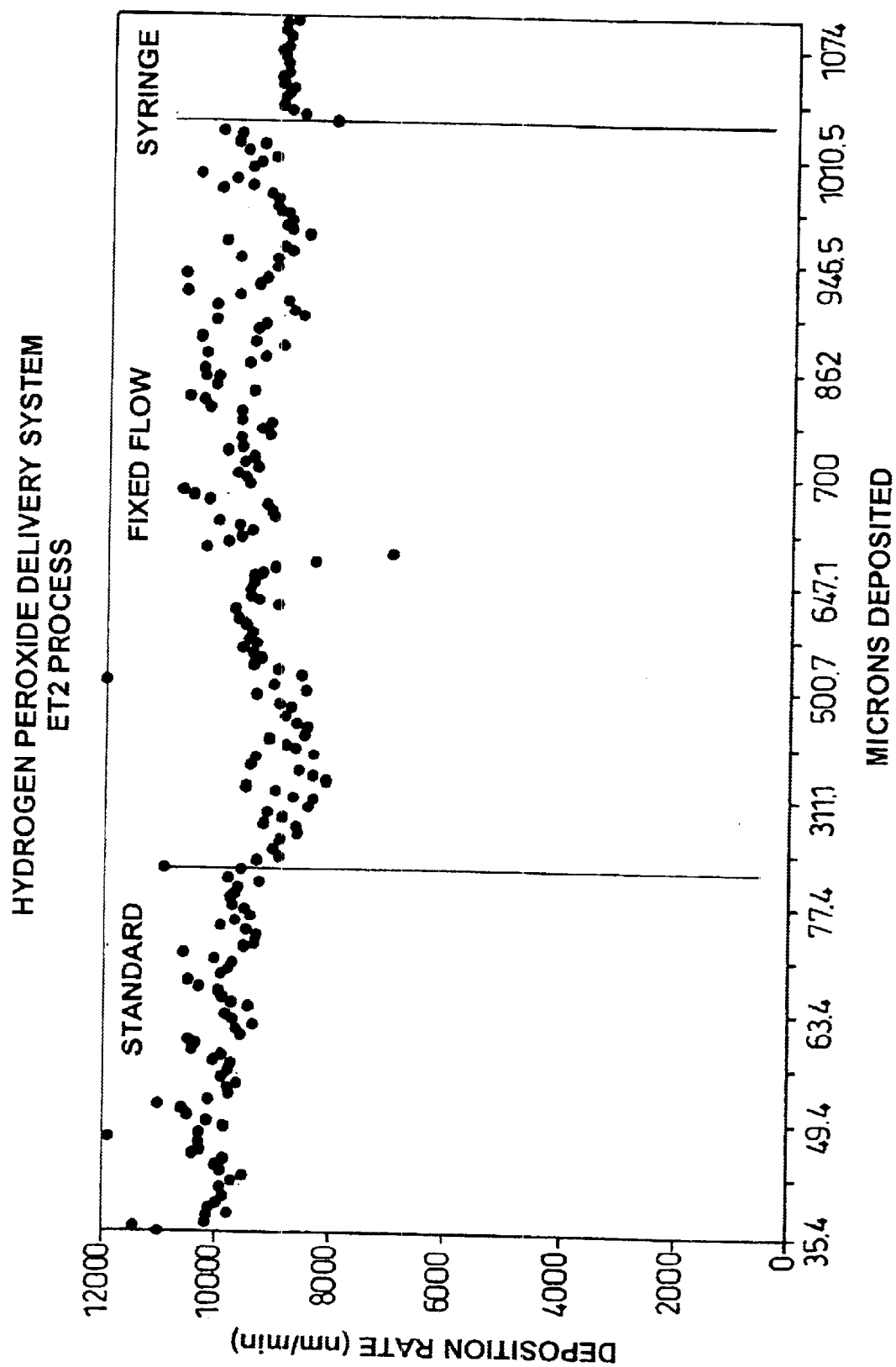
FIG. 3 is a further graph indicating variations in deposition rates using a variety of liquid precursor delivery systems.

FIG. 3 illustrates the resultant benefits in terms of repeatability deposition rate. It will be seen that the syringe produces a very repeatable level of deposition using a hydrogen peroxide system as compared with earlier delivery proposals.

The system has a number of advantages:
1. It can be self primed at the beginning of a run and hence clear any lines of degraded hydrogen peroxide and bubbles from the line and syringe.
2. The syringe need only be filled immediately prior to the process avoiding degradation of the liquid precursor.
3. The delivery rate can be fully programmable.
4. The delivery rate can be fully monitored by the linear encoder.
5. Any excess liquid precursor is returned to the source at the end of the process.
6. Continuous running through the automatic bottle changeover can be easily achieved. These benefits have been particularly noted with such precursors as hydrogen peroxide which do tend to degrade when not kept under suitable conditions. The delivery system also works very well with hydrogen peroxide being accurate to below 1 gram per minute. Flow rates can be easily changed without any significant loss of accuracy simply by changing the pump tubes and the matching pistons.

Experiments, which are reported, in our copending UK Patent application 0001179.1 entitled "Method and Apparatus for forming a film on a substrate" using conventional systems and then a syringe pump to deliver cyclohexyldimethoxymethylsilane show that for at least some precursors and processes acceptable results are only obtained when a syringe pump assembly as described is used. This disclosure is incorporated herein by reference.

What is claimed is:
1. Apparatus for delivering a desired volume of liquid precursor, comprising:
   a semiconductor processing reactor having an evaporator connected thereto;
   a source for the liquid precursor;
   a variable volume pump that can deliver various volumes of the precursor from said source to said reactor via said evaporator, said variable volume pump including a pump chamber connected to said source for the precursor and to the evaporator, and a piston that is linearly displaceable to pump a volume of the precursor from said chamber corresponding to the displacement of said piston;
   a detector which detects the relative position of said piston;
   a motor connected to said piston and operable to drive said piston linearly; and
   a control circuit operatively connected to said motor so as to control the operation of said motor and operatively connected to said detector so as to receive signals therefrom indicative of the relative position of said piston, said control circuit operating under feedback from said detector to stop said motor when said piston reaches a given position such that the desired volume of liquid precursor, independent of the volume of said chamber, is expelled from said chamber to said reactor;

wherein said apparatus further comprises an inlet tube leading from said chamber of said variable volume pump towards said source for the precursor, an outlet tube leading from said chamber of said variable volume pump towards said reactor, and a valve operable to selectively place said inlet tube and said outlet tube in open communication with said chamber; and wherein said control circuit is operatively connected to said valve and to said reactor so as to control said valve to place said chamber of said variable volume pump in open communication with said inlet tube and to operate said motor to drive said piston in a direction that causes said precursor to be induced into said chamber, while said reactor is not processing with precursor from said source.

2. Apparatus for delivering a desired volume of liquid precursor, comprising:

a semiconductor processing reactor having an evaporator connected thereto;

a source for the liquid precursor;

a variable volume pump that can deliver various volumes of the precursor from said source to said reactor via said evaporator, said variable volume pump including a pump chamber connected to said source for the precursor and to the evaporator, and a piston that is linearly displaceable to pump a volume of the precursor from said chamber corresponding to the displacement of said piston;

a detector which detects the relative position of said piston;

a motor connected to said piston and operable to drive said piston linearly; and a control circuit operatively connected to said motor so as to control the operation of said motor and operatively connected to said detector so as to receive signals therefrom indicative of the relative position of said piston, said control circuit operating under feedback from said detector to stop said motor when said piston reaches a given position such that the desired volume of liquid precursor, independent of the volume of said chamber, is expelled from said chamber to said reactor;

wherein said apparatus further comprises an inlet tube leading from said chamber of said variable volume pump towards said source for the precursor, an outlet tube leading from said chamber of said variable volume pump towards said reactor, and a valve operable to selectively place said inlet tube and said outlet tube in open communication with said chamber; and wherein said control circuit is operative to control said valve to place said chamber of said variable volume pump in open communication with said outlet and inlet tubes and to operate said motor to drive said piston in a direction that expels precursor from said chamber after said piston has reached said given position in said chamber, whereby said variable volume pump returns undelivered precursor to said source.

3. Apparatus for delivering a desired volume of liquid precursor, comprising:

a semiconductor processing reactor having an evaporator connected thereto;

a source for the liquid precursor;

a variable volume pump that can deliver various volumes of the precursor from said source to the reactor via said evaporator, said pump having a pump chamber;

an inlet tube leading from said pump chamber towards said source for the precursor; an outlet tube leading from said pump chamber towards the reactor;

a valve operable to selectively place said inlet tube and said outlet tube in open communication with said variable volume pump; and a control circuit operative to control said valve to place said inlet tube in open communication with said variable volume pump and to concurrently operate said motor to drive said pump in a direction that expels precursor from said chamber after said pump has expelled the desired volume of precursor to the reactor via said outlet tube, wherein said variable volume pump returns undelivered precursor to said source via said inlet tube.

4. A method of delivering a liquid precursor to a semiconductor processing reactor, said method comprising:

determining a desired volume of the liquid precursor that is to be delivered to the reactor for carrying out a process therein;

charging a chamber of a variable volume pump, connected to the reactor via an outlet tube, with the liquid precursor from a source of the liquid precursor;

driving a piston of the pump to expel liquid precursor from the chamber and to the reactor via the outlet tube, the displacement of the piston from a starting position corresponding to the volume of liquid precursor expelled;

monitoring the position of the piston relative to the starting position thereof; and stopping the piston, based on said monitoring, when the relative position of the piston is indicative of the piston having expelled the desired volume of the liquid precursor from the chamber of the pump, whereby the desired volume of liquid precursor delivered to the reactor is independent of the volume of the chamber of the pump;

said method further comprising alternately placing the chamber of the pump in open communication with an inlet tube, connected to a source of the liquid precursor, and then with the outlet tube; and driving the piston of the pump in one direction when the chamber is opened to the inlet tube to induce the liquid precursor into the chamber; wherein the piston of the pump is driven in the other direction when the chamber is placed in open communication with the outlet tube to expel the liquid precursor from the chamber; and said method further comprising driving the piston of the pump in said another direction when the chamber is placed in open communication with the inlet tube to return to the source an amount of liquid precursor that remains in the chamber after the desired volume of the liquid precursor has been expelled from the chamber, and before the chamber is again charged with the liquid precursor.

* * * * *